United States Patent
Kim et al.

(10) Patent No.: US 10,034,381 B2
(45) Date of Patent: Jul. 24, 2018

(54) FLEXIBLE SUBSTRATE HAVING A VIA-HOLE WITH A CONDUCTIVE MATERIAL AND A METHOD FOR MANUFACTURING THE SAME

(71) Applicant: KOREA INSTITUTE OF MACHINERY & MATERIALS, Daejeon (KR)

(72) Inventors: Yong-Jin Kim, Daejeon (KR); Jae-Hak Lee, Daejeon (KR); Ju-Yong Lee, Incheon (KR); Joon-Yub Song, Daejeon (KR); Seung-Man Kim, Daejeon (KR); Chang-Woo Lee, Daejeon (KR); Tae-Ho Ha, Daejeon (KR)

(73) Assignee: KOREA INSTITUTE OF MACHINERY & MATERIALS, Daejeon (KR)

(*) Notice: Subject to any disclaimer, the term of this patent is extended or adjusted under 35 U.S.C. 154(b) by 0 days.

(21) Appl. No.: 15/323,916

(22) PCT Filed: Oct. 19, 2015

(86) PCT No.: PCT/KR2015/011003
§ 371 (c)(1),
(2) Date: Jan. 4, 2017

(87) PCT Pub. No.: WO2017/018600
PCT Pub. Date: Feb. 2, 2017

(65) Prior Publication Data
US 2017/0207171 A1    Jul. 20, 2017

(30) Foreign Application Priority Data

Jul. 24, 2015  (KR) .................. 10-2015-0104835

(51) Int. Cl.
*H05K 3/00* (2006.01)
*H01L 23/538* (2006.01)
(Continued)

(52) U.S. Cl.
CPC ......... *H05K 3/0017* (2013.01); *H01L 21/486* (2013.01); *H01L 23/145* (2013.01);
(Continued)

(58) Field of Classification Search
CPC .... H05K 3/0017; H05K 3/002; H05K 3/0023; H05K 3/0026; H05K 3/0041; H05K 3/0047; H05K 3/005
See application file for complete search history.

(56) References Cited

U.S. PATENT DOCUMENTS 8,198,198 B2   6/2012   Yoo et al.
8,569,164 B2   10/2013  Park et al.
(Continued)

FOREIGN PATENT DOCUMENTS

KR   10-2005-0122630 A   12/2005
KR   10-2010-0109698 A   10/2010
(Continued)

*Primary Examiner* — Jeremy C Norris
(74) *Attorney, Agent, or Firm* — Hauptman Ham, LLP

(57) ABSTRACT

In a flexible substrate and a method for manufacturing the flexible substrate, the flexible substrate includes a polymer substrate, a through conductive material, an upper conductive material and a lower conductive material. The polymer substrate has a via-hole, and the via-hole is formed by a pattern formed via a photolithography and passes through the polymer substrate. The through conductive material fills the via-hole of the polymer substrate. The upper conductive material is planarized and is patterned to form an upper substrate of the polymer substrate in a plane with an upper substrate of the through conductive material. The lower conductive material is planarized and is patterned to form a
(Continued)

lower substrate of the polymer substrate in a plane with a lower substrate of the through conductive material.

8 Claims, 11 Drawing Sheets

(51) Int. Cl.
*H01L 23/14* (2006.01)
*H01L 23/498* (2006.01)
*H01L 21/48* (2006.01)

(52) U.S. Cl.
CPC .... *H01L 23/49866* (2013.01); *H01L 23/5384* (2013.01); *H01L 23/5387* (2013.01)

(56) References Cited

U.S. PATENT DOCUMENTS

| | | |
|---|---|---|
| 2012/0217648 A1 | 8/2012 | Park et al. |
| 2015/0187742 A1 | 7/2015 | Kwon et al. |

FOREIGN PATENT DOCUMENTS

| | | |
|---|---|---|
| KR | 10-2010-0129968 A | 12/2010 |
| KR | 10-2011-0076606 A | 7/2011 |
| KR | 10-2012-0097310 A | 9/2012 |
| KR | 10-2013-0132162 A | 12/2013 |

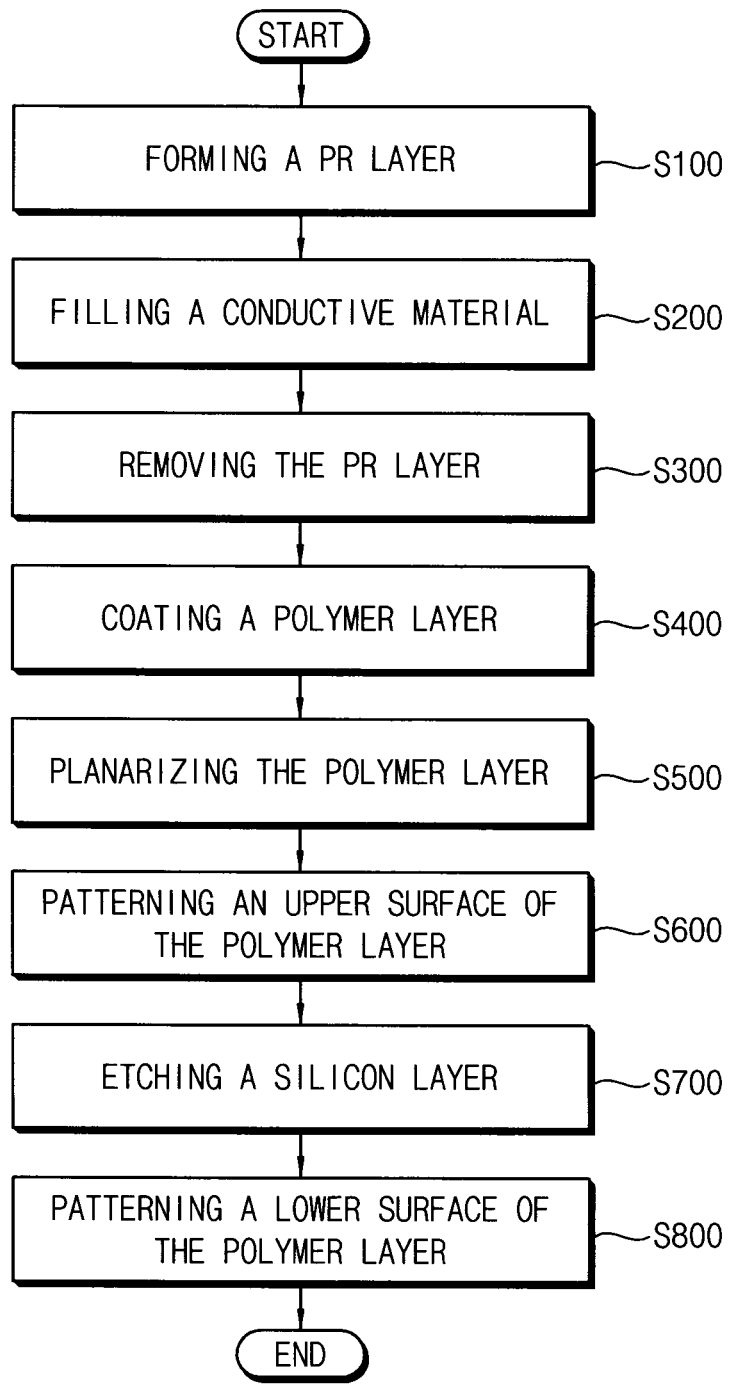

US 10,034,381 B2

FLEXIBLE SUBSTRATE HAVING A VIA-HOLE WITH A CONDUCTIVE MATERIAL AND A METHOD FOR MANUFACTURING THE SAME

CROSS-REFERENCE TO RELATED APPLICATIONS

This application is a U.S. National Phase of International Application Number PCT/KR2015/011003, filed Oct. 19, 2015, and claims priority under 35 U.S.C. § 119 to Korean Patent Application No. 10-2015-0104835, filed on Jul. 24, 2015, in the Korean Intellectual Property Office (KIPO).

BACKGROUND

1. Field of Disclosure

The present disclosure of invention relates to a flexible substrate having a via-hole and a method for manufacturing the flexible substrate, and more specifically the present disclosure of invention relates to a flexible substrate having a vertical via-hole with a conductive material for an electric connecting and having relatively low dielectric constant.

2. Description of Related Technology

Recently, a plurality of semiconductor chips is vertically stacked in addition to manufacturing a fine circuit in manufacturing a semiconductor, to complete or perform a complex circuit in the semiconductor.

Here, a method in which various kinds of semiconductor chips or wafers are vertically stacked and are connected with each other through a via-hole may be called as system in package (SiP).

In the SiP, a plurality of chips is vertically stacked to minimize a size of the semiconductor. Thus, forming the via-hole for connecting may be a core technology in the SiP.

In addition, in a recent developed semiconductor device, a flexible device is more necessary. Here, in the flexible device, compared to a conventional silicon based semiconductor device, manufacturing processes are formed on a polymer substrate such as polyimide, polyethylene phthalate (PET), polydimethylsiloxane (PDMS), ecoflex and so on, or a polished silicon based device with a relatively small thickness is mounted on the polymer substrate.

To electrically connect the silicon based devices with each other, thorough silicon via (TSV) is spotlighted recently. In the TSV, a plurality of substrates is stacked and a via-hole passing through the substrates vertically is formed to connect the substrates electrically.

In the conventional TSV, a step of via formation, a step of via filling, and a step of planarization are included. In the via formation, a vertical via-hole having a high aspect ratio is formed using a deep reactive ion etching. In the via filling, the via-hole is filled via an electroplating after forming a dielectric layer, a diffusion barrier layer and a seed layer. In the planarization, the via-hole is planarized via a chemical mechanical polishing (CMP).

In forming the vertical via-hole through the flexible substrate, the dielectric layer and the diffusion barrier layer are unnecessary to be formed, and thus a process may be simplified. However, in using the deep reactive ion etching, the via-hole having the high aspect ratio may be hard to be formed, and a heat generated in forming a plasma may damage the flexible substrate.

In addition, in the electroplating, a void may be formed and thus electric characteristics may be decreased.

As for a prior art, Korean laid-open patent application No. 10-2005-0122630 discloses an electroplating forming a relatively thick metal layer.

SUMMARY

The present invention is developed to solve the above-mentioned problems of the related arts. The present invention provides a flexible substrate having a vertical via-hole with a conductive material for an electric connecting and having relatively low dielectric constant.

In addition, the present invention also provides a method for manufacturing the flexible substrate.

According to an example embodiment, a flexible substrate includes a polymer substrate, a through conductive material, an upper conductive material and a lower conductive material. The polymer substrate has a via-hole, and the via-hole is formed by a pattern formed via a photolithography and passes through the polymer substrate. The through conductive material fills the via-hole of the polymer substrate. The upper conductive material is planarized and is patterned to form an upper substrate of the polymer substrate in a plane with an upper substrate of the through conductive material. The lower conductive material is planarized and is patterned to form a lower substrate of the polymer substrate in a plane with a lower substrate of the through conductive material.

In an example embodiment, the polymer substrate may include polyimide or polyamic acid.

In an example embodiment, the through conductive material, the upper conductive material and the lower conductive material may include one of nickel, copper, silver, carbon nanotube (CNT) and graphene.

According to another example embodiment, in a method for manufacturing a flexible substrate, a polymer layer is formed on a silicon layer on which a seed layer is coated, a conductive material filling a via-hole of the polymer layer. The polymer layer filled with the conductive material is planarized via a chemical mechanical polishing (CMP). An upper surface of the planarized polymer layer is patterned. The silicon layer on which the seed layer is coated under the polymer layer is etched. A lower surface of the polymer layer on which the silicon layer is removed is patterned.

In an example embodiment, the polymer layer may include polyimide or polyamic acid.

In an example embodiment, the polymer layer may be formed via one of a bar coating, a slit coating, a molding and a spin coating.

In an example embodiment, the conductive material may include one of nickel, copper, silver, carbon nanotube (CNT) and graphene.

In an example embodiment, the silicon substrate may be etched using a buffered oxide etchant (BOE) or via a laser temporary bonding/debonding.

In an example embodiment, in forming the polymer layer, the polymer layer may be coated with a multi-layer, and a solvent increasing viscosity may be added to control a thickness of the polymer layer.

In an example embodiment, forming the polymer layer may include forming a photoresist (PR) layer having a predetermined pattern with a space on the silicon substrate on which the seed layer is coated via a photolithography, filling a conductive material to the space of the PR layer via a plating, removing the PR layer, and coating the polymer layer to fill the conductive material to the silicon substrate from which the PR layer is removed.

In an example embodiment, forming the polymer layer may include forming a PR layer having predetermined patterns spaced apart from each other on the silicon substrate on which the seed layer is coated via a photolithography, coating the polymer layer on the silicon substrate on which the PR layer, removing the PR layer, and filling a conductive material to a space of the polymer layer via a plating, the space of the polymer layer being formed by removing the PR layer.

According to the present example embodiments, the flexible substrate has a polymer material and a via-hole filled with a conductive material capable of electric connecting, and the via-hole vertically passes through a polymer layer and is filled with the conductive material, so that the flexible substrate is flexible and has a relatively low dielectric constant. Thus, electric characteristics may be enhanced.

In addition, in coating the polymer material, one of a bar coating, a slit coating, a molding and a spin coating is used, such that a relatively large-sized coating may be performed with more uniformity.

BRIEF DESCRIPTION OF THE DRAWINGS

FIG. 2 is a flow chart illustrating a method for manufacturing the flexible substrate in FIG. 1;

DETAILED DESCRIPTION

Figure 1:
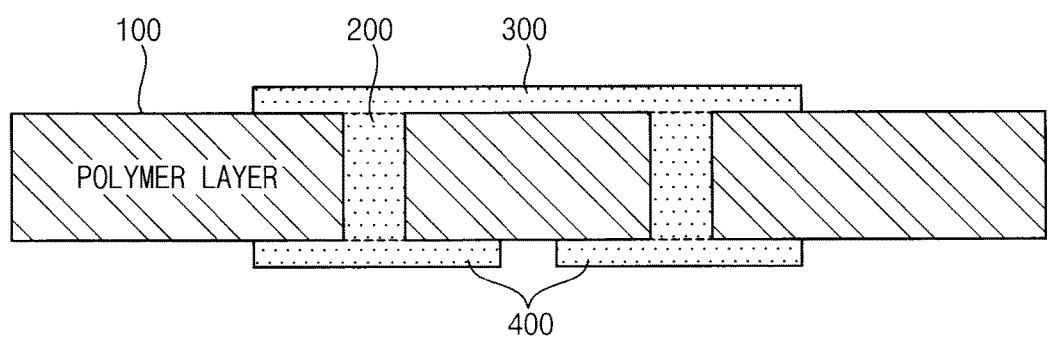
FIG. 1 is a side view illustrating a flexible substrate according to an example embodiment of the present invention.

The invention is described more fully hereinafter with Reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that, although the terms first, second, third etc. may be used herein to describe various elements, components, regions, layers and/or sections, these elements, components, regions, layers and/or sections should not be limited by these terms.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. Hereinafter, exemplary embodiment of the invention will be explained in detail with reference to the accompanying drawings.

FIG. 1 is a side view illustrating a flexible substrate according to an example embodiment of the present invention.

Referring to FIG. 1, the flexible substrate according to the present example embodiment includes a polymer substrate 100, a through conductive material 200, an upper conductive material 300 and a lower conductive material 400. The polymer substrate 100 has a plurality of via-holes, and the via-holes are formed by a pattern formed via a photolithography and pass through the polymer substrate. The through conductive material 200 fills the via-hole of the polymer substrate 100. The upper conductive material 300 is planarized and is patterned to form an upper substrate of the polymer substrate 100 in a plane with an upper substrate of the through conductive material 200. The lower conductive material 400 is planarized and is patterned to form a lower substrate of the polymer substrate 100 in a plane with a lower substrate of the through conductive material 200.

The flexible substrate is manufactured by the method explained below, and thus the method is explained below in detail.

Here, the polymer substrate may include polyimide or polyamic acid, and the polyimide may be colorless, yellow and so on.

The conductive material for the flexible substrate may include one of nickel, copper, silver, carbon nanotube (CNT) and graphene.

The flexible substrate has the polymer material and the via-hole filled with a conductive material capable of electric connecting, so that the flexible substrate is flexible and has a relatively low dielectric constant. Thus, electric characteristics may be enhanced, and a water-proof may be enhanced due to lower water transmissivity.

FIG. 2 is a flow chart illustrating a method for manufacturing the flexible substrate in FIG. 1. FIGS. 3A to 3H are side views illustrating the method for manufacturing the flexible substrate in FIG. 2.

Referring to FIG. 2, the method for manufacturing the flexible substrate includes forming a photoresist (PR) layer S100, filling a conductive material S200, removing the PR layer S300, coating a polymer layer S400, planarizing the polymer layer S500, patterning an upper surface of the polymer layer S600, etching a silicon layer S700, and patterning a lower surface of the polymer layer S800.

The method is explained in detail referring to FIGS. 3A to 3H.

In forming a PR layer S100, a predetermined PR layer is formed on a silicon substrate on which a seed layer is coated, via a photolithography.

Figure 3A:
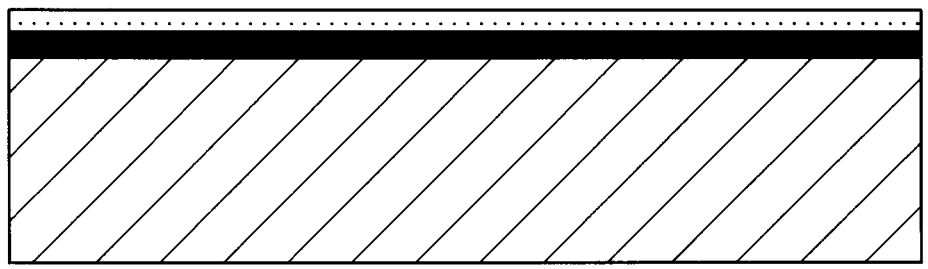
FIGS. 3A to 3H are side views illustrating the method for manufacturing the flexible substrate in FIG. 2.
Figure 3B:
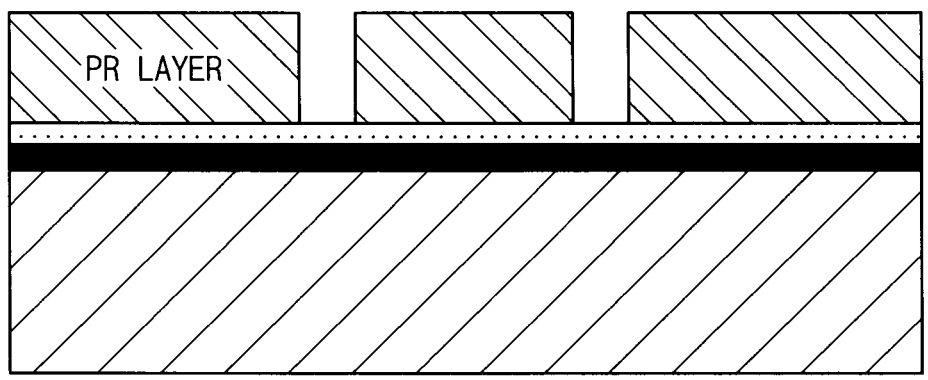

For example, after a silicon dioxide ($SiO_2$) layer and the seed layer are coated as illustrated in FIG. 3A, the PR layer is formed via the photolithography as illustrated in FIG. 3B. Here, the photolithography and forming the PR layer via the photolithography are prior arts.

Figure 3C:
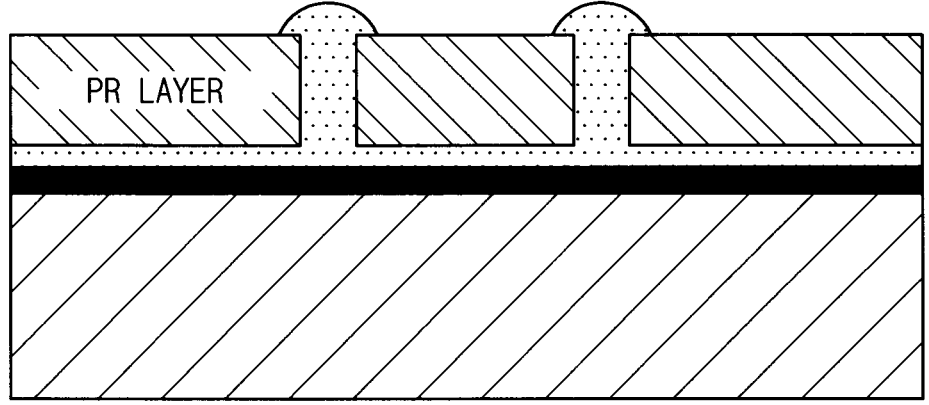

In filling a conductive material S200, as illustrated in FIG. 3C, a space having a predetermined pattern formed via the PR layer in the forming the PR layer S100, is filled with the conductive material via a plating.

For example, the conductive material may include one of nickel, copper, gold, silver, carbon nanotube (CNT) and graphene.

In the filling the conductive material S200, the space having the predetermined pattern due to the PR layer formed on the silicon substrate, is filled with the conductive material, and in the plating, a bottom-up filling method may be used. Thus, a void which may be formed in a via-hole may be prevented to be formed.

Figure 3D:
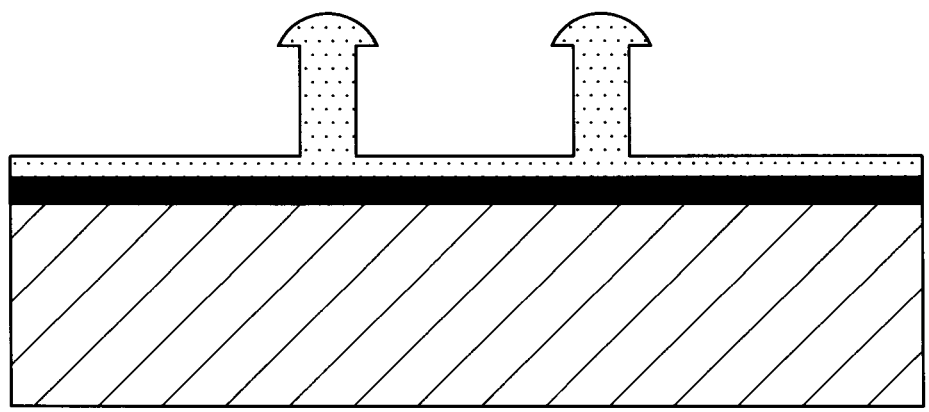

In removing the PR layer S300, as illustrated in FIG. 3D, the PR layer formed in the forming the PR layer S100 is removed.

Figure 3E:
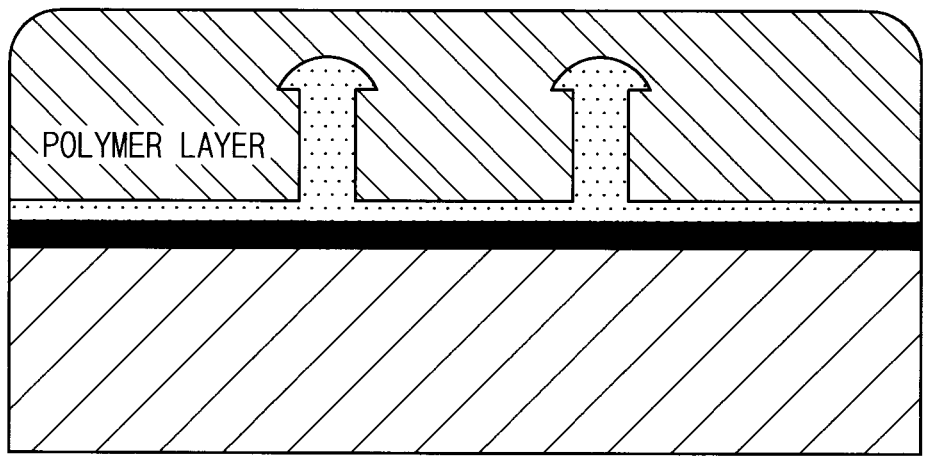

In coating a polymer layer S400, as illustrated in FIG. 3E, a polymer layer is coated on the silicon substrate on which the PR layer is removed in the removing the PR layer S300.

In the coating the polymer layer S400, the conductive material is formed to be a plurality of columns having a predetermined pattern on the silicon substrate, and the polymer layer is coated on the silicon substrate having the conductive material formed thereon.

Here, the polymer substrate may include polyimide or polyamic acid, and the polyimide may be a colorless type or a yellow type.

In addition, the polymer layer may be coated via one of a bar coating, a slit coating, a molding and a spin coating in the coating the polymer layer S400. Thus, a relatively large-size coating may be possible.

In the present example embodiment, a thickness of the polymer layer may be controlled by the coating the polymer layer S400.

For example, the polymer layer may be formed with a multi-layer to increase the thickness thereof, or a solvent is added to increase viscosity of the polymer layer to increase the thickness thereof.

Alternatively, the thickness of the polymer layer may be easily controlled to be decreased.

Figure 3F:
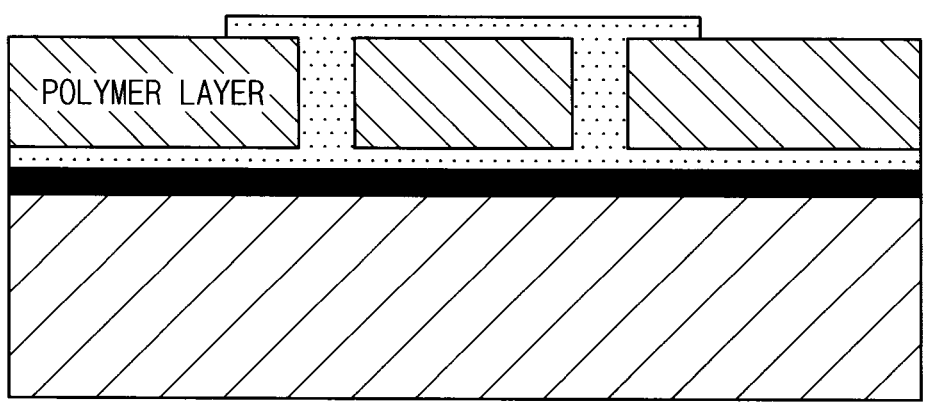

In planarizing the polymer layer S500, as illustrated in FIG. 3F, the polymer coated in the coating the polymer layer S400 is planarized to expose the conductive material. Here, in the planarizing the polymer layer S500, a chemical mechanical polishing (CMP) may be used to planarized an upper surface of the polymer layer.

In patterning an upper surface of the polymer layer S600, the upper surface of the polymer layer planarized in the planarizing the polymer layer S500 is line-patterned.

Thus, an upper surface of the polymer layer is in a plane with an upper surface of the conductive material, and a height may be controlled.

Figure 3G:
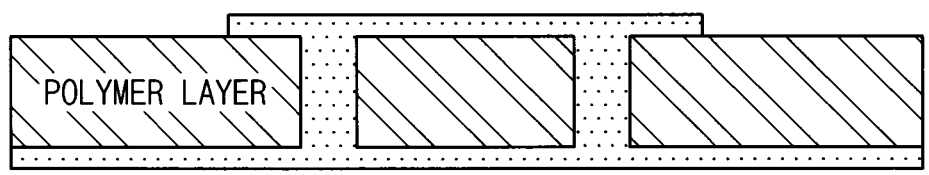

In etching a silicon layer S700, as illustrated in FIG. 3G the silicon substrate on which the seed layer is coated under the polymer layer is etched by cleaning the surface of the silicon substrate, and thus, the conductive material passing through the polymer layer merely remains to be the flexible substrate.

Here, in the etching the silicon layer S700, a buffered oxide etchant (BOE) or a laser temporary bonding/debonding may be used, to etch the silicon substrate having the polymer layer with the seed layer. The BOE is more effective when the size of the silicon substrate is relatively small, and the laser temporary bonding/debonding is more effective when the size of the silicon substrate is relatively large or when a massive production is necessary.

Figure 3H:
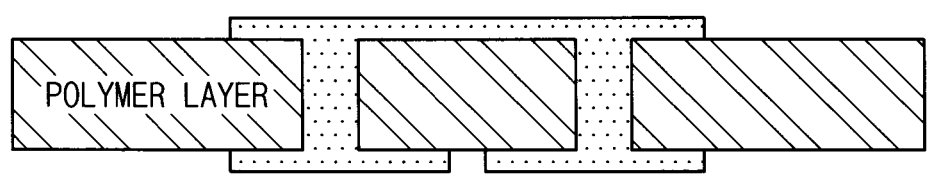

In patterning a lower surface of the polymer layer S800, as illustrated in FIG. 3H, a lower surface of the polymer layer from which the silicon layer is removed is line-patterned.

Thus, the lower surface of the polymer layer and the lower surface of the exposed conductive material are in a plane, and the height thereof may be controlled.

According to the method of the present example embodiment, the flexible substrate as illustrated in FIG. 1, includes the conductive material passing through the polymer layer along a vertical direction and filling the via-hole. Thus, the flexible substrate is flexible and has a relatively low dielectric constant. Thus, electric characteristics may be enhanced. Further, a water-proof may be enhanced due to lower water transmissivity.

Figure 4:
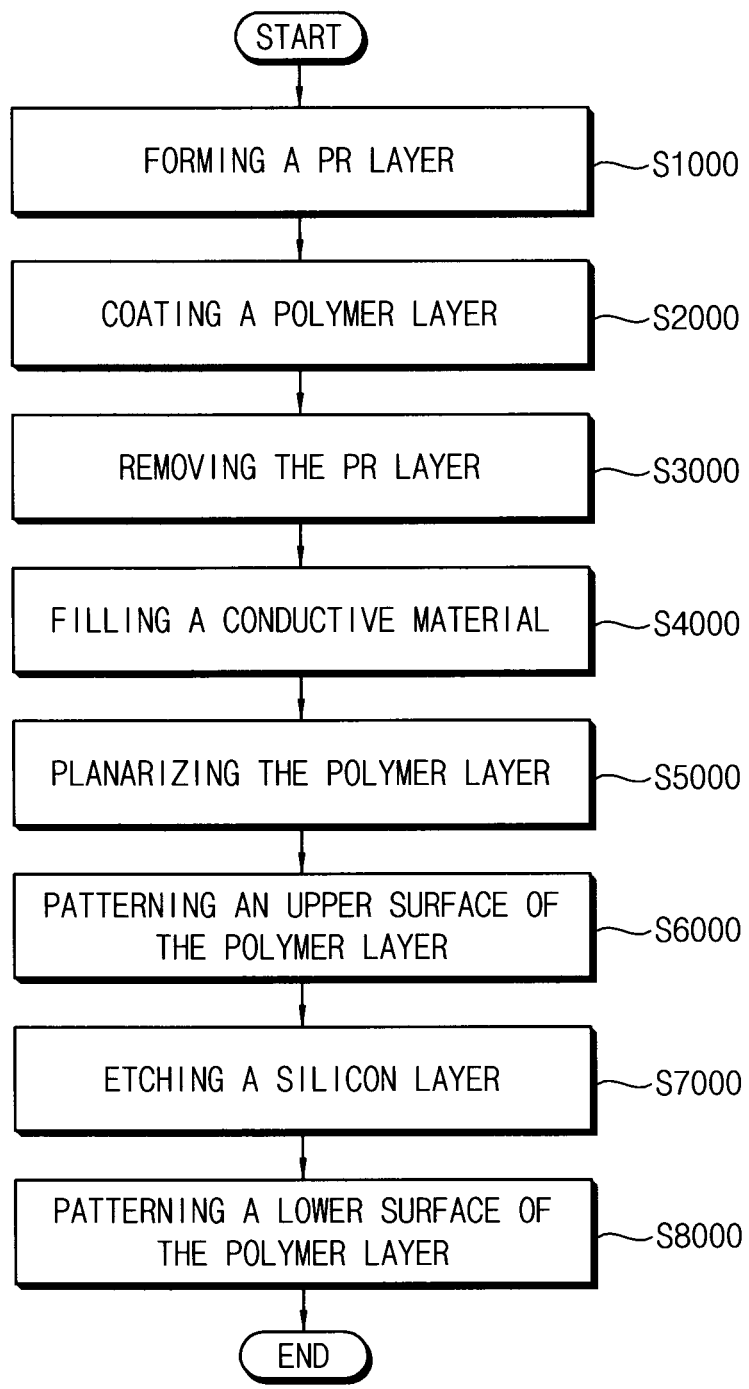
FIG. 4 is a flow chart illustrating a method for manufacturing the flexible substrate according to another example embodiment of the present invention.

FIG. 4 is a flow chart illustrating a method for manufacturing the flexible substrate according to another example embodiment of the present invention. FIGS. 5A to 5H are side views illustrating the method for manufacturing the flexible substrate in FIG. 4.

Referring to FIG. 4, the method for manufacturing the flexible substrate according to the present example embodiment, includes forming a photoresist (PR) layer S1000, coating a polymer layer S2000, removing the PR layer S3000, filling a conductive material S4000, planarizing the polymer layer S5000, patterning an upper surface of the polymer layer S6000, etching a silicon layer S7000, and patterning a lower surface of the polymer layer S8000.

Referring to FIGS. 5A to 5H, the method is explained below in detail.

In forming a photoresist (PR) layer S1000, a predetermined PR layer is formed on a silicon substrate on which a seed layer is coated, via a photolithography.

Figure 5A:
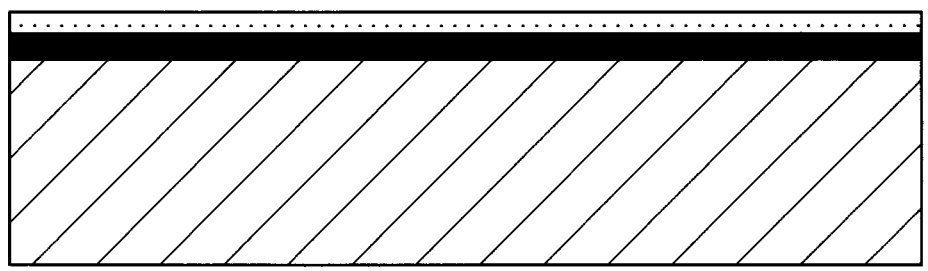
FIGS. 5A to 5H are side views illustrating the method for manufacturing the flexible substrate in FIG. 4.
Figure 5B:
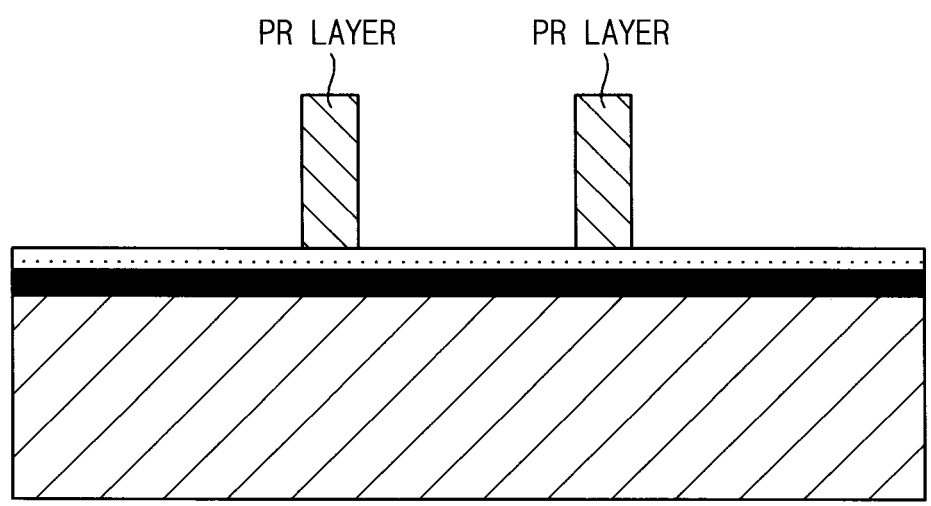

For example, after a silicon dioxide ($SiO_2$) layer and the seed layer are coated as illustrated in FIG. 5A, the PR layer is formed via the photolithography as illustrated in FIG. 5B. Here, the photolithography and forming the PR layer via the photolithography are prior arts.

Here, the PR layer via the forming the PR layer S100 in FIG. 3A is different from that via the forming the PR layer S1000 in FIG. 5B.

Thus, in the method according to the present example embodiment, coating a polymer layer S2000 is performed after the forming the PR layer S1000.

Figure 5C:
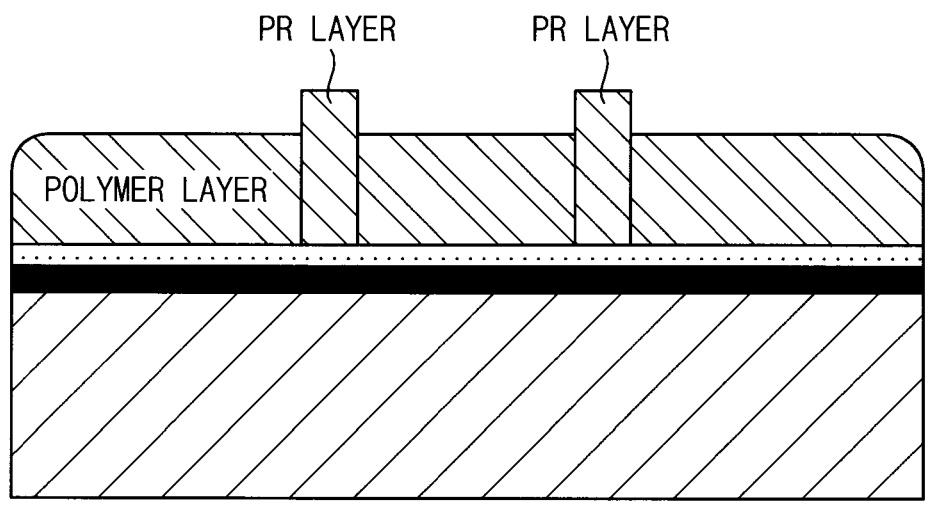

In coating the polymer layer S2000, as illustrated in FIG. 5C, the polymer layer is coated on the upper surface of the silicon substrate on which the predetermined PR pattern is formed via the forming the PR layer.

The polymer layer and a plurality of column shape PR layers are formed on the silicon substrate. The polymer substrate may include polyimide or polyamic acid, and the polyimide may be a colorless type or a yellow type.

In addition, the polymer layer may be coated via one of a bar coating, a slit coating, a molding and a spin coating in the coating the polymer layer S2000. Thus, a relatively large-size coating may be possible.

In the present example embodiment, a thickness of the polymer layer may be controlled by the coating the polymer layer S2000.

For example, the polymer layer may be formed with a multi-layer to increase the thickness thereof, or a solvent is added to increase viscosity of the polymer layer to increase the thickness thereof.

Alternatively, the thickness of the polymer layer may be easily controlled to be decreased.

Figure 5D:
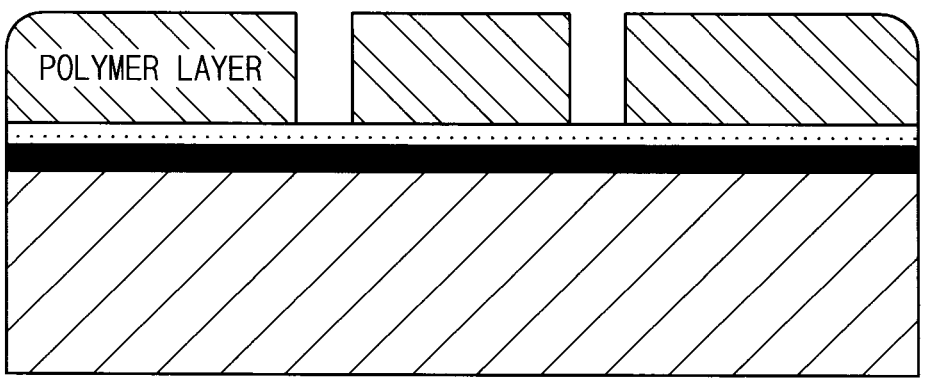
Figure 5E:
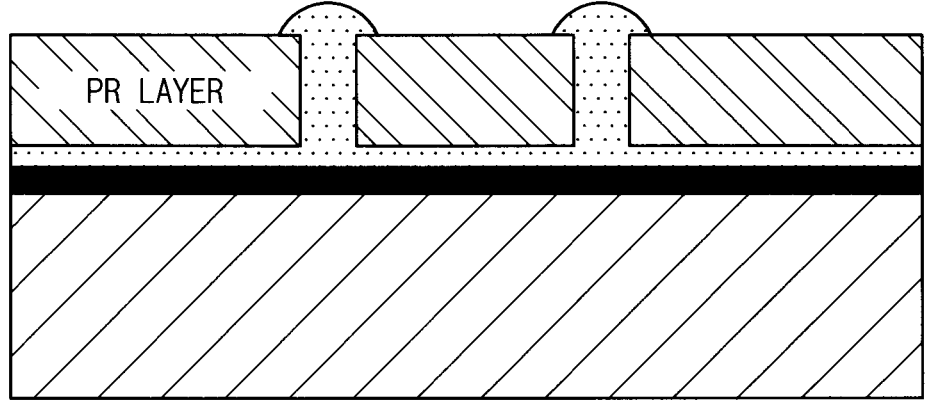

In removing the PR layer S3000, as illustrated in FIG. 5D, the PR layer formed via the forming the PR layer S1000 is removed. Thus, a via-hole is formed through the polymer layer.

Here, the removing the PR layer may be performed using the prior arts.

In filling a conductive material S4000, the polymer layer has a space having a predetermined pattern via the removing the PR layer S3000 and is filled with the conductive material via the plating.

For example, the conductive material may include one of nickel, copper, gold, silver, carbon nanotube (CNT) and graphene.

In the filling the conductive material S4000, a bottom-up filling is used to prevent the void from being formed in the via-hole.

Figure 5F:
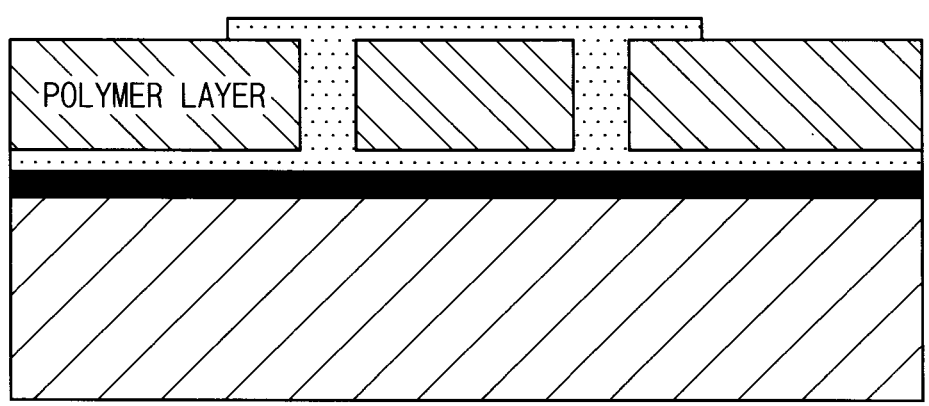

In planarizing the polymer layer S5000, as illustrated in FIG. 5F, the polymer filled with the conductive material in the filling the conductive material S4000 is planarized. Here, in the planarizing the polymer layer S5000, a chemical mechanical polishing (CMP) may be used to planarized an upper surface of the polymer layer.

In patterning an upper surface of the polymer layer S6000, the upper surface of the polymer layer planarized in the planarizing the polymer layer S5000 is patterned. Here, an upper surface of the polymer layer is in a plane with an upper surface of the conductive material, and a height may be controlled.

Figure 5G:
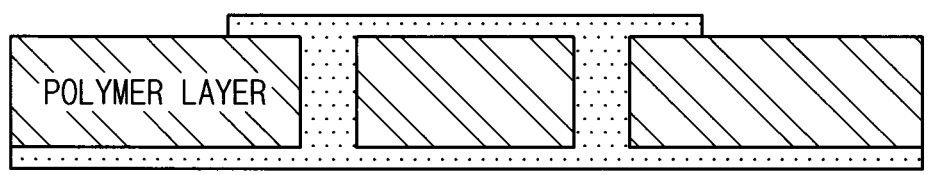

In etching a silicon layer S7000, as illustrated in FIG. 5G the silicon substrate on which the seed layer is coated under the polymer layer is etched by cleaning the surface of the silicon substrate, and thus, the conductive material passing through the polymer layer merely remains to be the flexible substrate.

Here, in the etching the silicon layer S7000, a buffered oxide etchant (BOE) or a laser temporary bonding/debonding may be used, to etch the silicon substrate having the polymer layer with the seed layer. The BOE is more effective when the size of the silicon substrate is relatively small, and the laser temporary bonding/debonding is more effective when the size of the silicon substrate is relatively large or when a massive production is necessary.

Figure 5H:
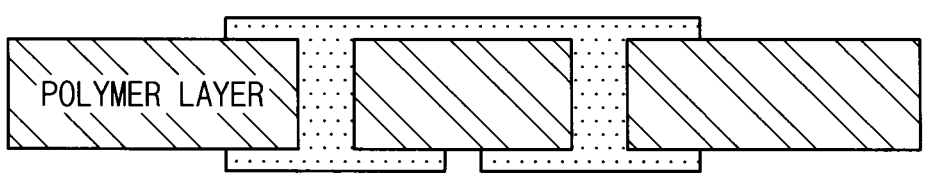

In patterning a lower surface of the polymer layer S8000, as illustrated in FIG. 5H, a lower surface of the polymer layer from which the silicon layer is removed is line-patterned.

Thus, the lower surface of the polymer layer and the lower surface of the exposed conductive material are in a plane, and the height thereof may be controlled.

According to the method of the present example embodiment, the flexible substrate includes the conductive material passing through the polymer layer along a vertical direction and filling the via-hole. Thus, the flexible substrate is flexible and has a relatively low dielectric constant. Thus, electric characteristics may be enhanced. Further, a waterproof may be enhanced due to lower water transmissivity.

Having described the example embodiments of the present invention and its advantage, it is noted that various changes, substitutions and alterations can be made herein without departing from the spirit and scope of the invention as defined by appended claims.

What is claimed is:

1. A method for manufacturing a flexible substrate, comprising:
    forming a polymer layer on a silicon layer on which a seed layer is coated, a conductive material filling a via-hole of the polymer layer;
    planarizing the polymer layer filled with the conductive material via a chemical mechanical polishing (CMP);
    patterning an upper surface of the planarized polymer layer;
    etching the silicon layer on which the seed layer is coated under the polymer layer; and
    patterning a lower surface of the polymer layer on which the silicon layer is removed.

2. The method of claim 1, wherein the polymer layer includes polyimide or polyamic acid.

3. The method of claim 1, wherein the polymer layer is formed via one of a bar coating, a slit coating, a molding and a spin coating.

4. The method of claim 1, wherein the conductive material includes one of nickel, copper, silver, carbon nanotube (CNT) and graphene.

5. The method of claim 1, wherein the silicon substrate is etched using a buffered oxide etchant (BOE) or via a laser temporary bonding/debonding.

6. The method of claim 1, wherein in forming the polymer layer, the polymer layer is coated with a multi-layer, and a solvent increasing viscosity is added to control a thickness of the polymer layer.

7. The method of claim 1, wherein forming the polymer layer comprising:
    forming a photoresist (PR) layer having a predetermined pattern with a space on the silicon substrate on which the seed layer is coated via a photolithography;
    filling a conductive material to the space of the PR layer via a plating;
    removing the PR layer; and
    coating the polymer layer to fill the conductive material to the silicon substrate from which the PR layer is removed.

8. The method of claim 1, wherein forming the polymer layer comprising:
    forming a PR layer having predetermined patterns spaced apart from each other on the silicon substrate on which the seed layer is coated via a photolithography;
    coating the polymer layer on the silicon substrate on which the PR layer;
    removing the PR layer; and
    filling a conductive material to a space of the polymer layer via a plating, the space of the polymer layer being formed by removing the PR layer.

* * * * *